(12) United States Patent
Yu et al.

(10) Patent No.: US 12,696,431 B2
(45) Date of Patent: Jul. 28, 2026

(54) MOTOR CONTROLLER AND VEHICLE WITH THE SAME

(71) Applicant: BYD COMPANY LIMITED, Shenzhen (CN)

(72) Inventors: Fengchuan Yu, Shenzhen (CN); Xingchun Zhang, Shenzhen (CN); Yanjun Fan, Shenzhen (CN); Guangming Yang, Shenzhen (CN); Axi Qi, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 216 days.

(21) Appl. No.: 18/373,531

(22) Filed: Sep. 27, 2023

(65) Prior Publication Data

US 2024/0023295 A1     Jan. 18, 2024

Related U.S. Application Data

(63) Continuation of application No. PCT/CN2022/077866, filed on Feb. 25, 2022.

(30) Foreign Application Priority Data

Apr. 28, 2021     (CN) .......................... 202110466701.4

(51) Int. Cl.
    *H05K 7/20*        (2006.01)
    *H05K 5/03*        (2006.01)
    (Continued)

(52) U.S. Cl.
    CPC .......... *H05K 7/20927* (2013.01); *H05K 5/03* (2013.01); *H05K 7/1427* (2013.01); *H05K 7/20872* (2013.01); *B60R 16/0239* (2013.01)

(58) Field of Classification Search
    CPC .......... H05K 7/20927; H05K 7/20254; H05K 7/20272; H05K 1/0203; H05K 7/14322; H05K 7/20; H05K 7/20218; H05K 7/20872; H01L 23/473; H01L 2924/13055; F28F 3/12
    See application file for complete search history.

(56) References Cited

U.S. PATENT DOCUMENTS

| | | | |
|---|---|---|---|
| 2009/0213546 A1 | 8/2009 | Hassani et al. | |
| 2009/0231811 A1* | 9/2009 | Tokuyama | ......... H05K 7/20927 |
| | | | 361/699 |

(Continued)

FOREIGN PATENT DOCUMENTS

| | | |
|---|---|---|
| CN | 108770323 A | 11/2018 |
| CN | 210579859 U | 5/2020 |

(Continued)

OTHER PUBLICATIONS

International Search Report and Written Opinion for Application No. PCT/CN2022/077866, mailed on Apr. 13, 2022, 9 pages.

*Primary Examiner* — Mandeep S Buttar
(74) *Attorney, Agent, or Firm* — Sheppard Mullin Richter & Hampton LLP

(57) ABSTRACT

A motor controller includes: a box including a first housing including a cooling chamber, and an insert-in hole and a protrude-out hole disposed on two opposite sidewalls of the cooling chamber; an IGBT module inserted into the cooling chamber, two opposite side surfaces of the IGBT module in a thickness direction and an inner wall of the cooling chamber forming liquid passing gaps, two ends of the IGBT module sealed with the first housing to seal the insert-in hole and the protrude-out hole; a control board and a drive board disposed in the box, the control board located on a surface of the drive board facing away from the IGBT module, and the drive board connected to the control board and the IGBT (Continued)

module; and a capacitor module located on a surface of the first housing facing away from the drive board and connected to the IGBT module.

20 Claims, 10 Drawing Sheets

(51) Int. Cl.
   *H05K 7/14*          (2006.01)
   *B60R 16/023*      (2006.01)

(56)                    References Cited

U.S. PATENT DOCUMENTS

2010/0025126  A1*   2/2010   Nakatsu ............. H05K 7/20927
                                                                  361/699
2010/0097765  A1*   4/2010   Suzuki ............... H05K 7/20927
                                                                  361/699
2013/0265808  A1*   10/2013  Ishii ........................ H02M 1/12
                                                                  363/97
2016/0270268  A1*   9/2016   Suzuki .................. H02M 7/003
2021/0408873  A1*   12/2021  Wang ........................ H02P 5/00

FOREIGN PATENT DOCUMENTS

CN              211128664  U        7/2020
CN              112224033  A        1/2021
CN              214707588  U       11/2021
CN              215453694  U        1/2022
WO      WO-2011040153  A1  *   4/2011   ........... H01L 23/473
WO              2013065472  A1        5/2013

* cited by examiner

MOTOR CONTROLLER AND VEHICLE WITH THE SAME

CROSS-REFERENCE TO RELATED APPLICATIONS

This application is a Continuation application of International Patent Application No. PCT/CN2022/077866, filed on Feb. 25, 2022, which is based on and claims priority to and benefits of Chinese Patent Application No. 202110466701.4, filed on Apr. 28, 2021. The entire content of all of the above-referenced applications is incorporated herein by reference.

FIELD

The present disclosure relates to the field of vehicle technologies, and more particularly, to a motor controller and a vehicle with the same.

BACKGROUND

Motor controller is one of the core components of vehicles in the related art. The power density of the motor controller largely depends on its heat dissipation performance. For this reason, some motor controllers are provided with water channels to dissipate heat from both an IGBT (Insulated Gate Bipolar Transistor) module and a capacitor module. However, the layout results in a small contact area between a coolant in a water channel and the IGBT module, which cannot effectively dissipate the heat from the IGBT module. When the heat dissipation effect is poor, the thickness of the motor controller is adjusted to increase, which is not suitable to minimize the motor controller.

SUMMARY

The present disclosure solves at least one of the technical problems in the related art. Therefore, one aspect of the present disclosure provides a motor controller and a vehicle with the same.

The present disclosure further provides a vehicle with the motor controller.

In a first aspect, an embodiment of the present disclosure provides a motor controller. The motor controller includes: a box, the box includes a first housing, the first housing includes a cooling chamber, and an insert-in hole and a protrude-out hole are respectively disposed on two opposite sidewalls of the cooling chamber; an IGBT module, the IGBT module is disposed in the box and inserted into the cooling chamber through the insert-in hole, two opposite side surfaces of the IGBT module in a thickness direction and an inner wall of the cooling chamber form liquid passing gaps, and two ends of the IGBT module are sealed with the first housing to seal the insert-in hole and the protrude-out hole; a control board and a drive board, the control board and the drive board is disposed in the box, the control board is located on a surface of the drive board facing away from the IGBT module, and the drive board is connected to the control board and the IGBT module; and a capacitor module, the capacitor module is located on a surface of the first housing facing away from the drive board, and the capacitor module is connected to the IGBT module and configured to dissipate heat through a coolant in the cooling chamber.

According to some embodiments of the present disclosure, multiple cooling chambers and an accommodating groove are defined in the first housing, the multiple cooling chambers are disposed as at least two rows of cooling water channels spaced apart, and the accommodating groove is located between two adjacent rows of the cooling water channels; multiple IGBT modules respectively correspond to the multiple cooling chambers, and each of the IGBT modules is inserted into the corresponding cooling chamber through the corresponding insert-in hole; and the accommodating groove faces away from the drive board, and the capacitor module is mounted in the accommodating groove and configured to dissipate heat through the coolant in two rows of cooling water channels adjacent to the accommodating groove.

According to some embodiments of the present disclosure, the multiple cooling chambers are disposed as two rows of cooling water channels, and the first housing includes a liquid inlet, a liquid outlet, a first communicating water channel, and a second communicating water channel; two ends of the first communicating water channel are respectively in communication with corresponding first ends of the two rows of cooling water channels, the second communicating water channel is in communication with a second end of a first one of the two rows of cooling water channels, one of the liquid inlet and the liquid outlet is in communication with a second end of a second one of the two rows of cooling water channels, and the other one of the liquid inlet and the liquid outlet is in communication with the second communicating water channel; the second communicating water channel, the first one of the two rows of cooling water channels, the first communicating water channel, and the second one of the two rows of cooling water channels are in communication and surround the accommodating groove.

According to some embodiments of the present disclosure, the motor controller further includes: a water channel cover plate, the first communicating water channel and the second communicating water channel are open on a first surface of the first housing including the insert-in hole, the water channel cover plate is mounted on the first surface of the first housing and covers the two rows of cooling water channels, the first communicating water channel, and the second communicating water channel, and the water channel cover plate has multiple through holes, for the multiple IGBT modules to run through.

According to some embodiments of the present disclosure, the box further includes: a first cover plate, the first cover plate is mounted on the first housing and covers the accommodating groove.

According to some embodiments of the present disclosure, the box further includes: a second housing, the second housing is mounted on the first housing, the drive board is located between the second housing and the first housing, the control board is located on a surface of the second housing facing away from the first housing.

According to some embodiments of the present disclosure, the motor controller further includes: a DC connector, the DC connector is mounted on a first surface of the first housing facing to the second housing, the first housing includes a bus interface for exposing the DC connector; a DC adapter, the DC adapter is mounted on the first surface of the first housing, a DC input end of the DC adapter is connected to the DC connector, a DC output end of the DC adapter is connected to the capacitor module; and a magnetic ring, the magnetic ring is mounted on the DC adapter and located between the DC input end and the DC output end.

According to some embodiments of the present disclosure, the capacitor module is mounted on a second surface of the first housing facing away from the second housing and includes a capacitor input end and a capacitor output end, the first housing includes a DC via, and the capacitor input end runs through the DC via and is connected to the DC output end of the DC adapter; an IGBT input end of the IGBT module is disposed close to the protrude-out hole, and the IGBT input end extends out of the protrude-out hole and is connected to the capacitor output end; a DC shielding cavity is formed in the first surface of the first housing facing to the second housing, the DC connector, the DC input end of the DC adapter, and the magnetic ring are disposed in the DC shielding cavity, and the bus interface runs through a side-wall of the DC shielding cavity.

According to some embodiments of the present disclosure, the second housing includes a fixing hole, the DC connector includes a DC bar, the DC bar runs through the fixing hole and is fixed to the second housing, and the DC bar is connected to the DC input end of the DC adapter; the second housing includes a signal via, the drive board includes a drive board signal pin, the control board includes a signal pin socket, and the drive board signal pin runs through the signal via and is inserted into the signal pin socket.

According to some embodiments of the present disclosure, the motor controller further includes: a discharge resistor, the discharge resistor includes a connection end, the second housing includes a discharge via, the connection end runs through the discharge via and is connected to the capacitor module, the discharge resistor and the capacitor module forming a conductive loop; and a high-voltage sampling terminal, the high-voltage sampling terminal is connected in parallel with the discharge resistor, the control board includes a high-voltage sampling connection base, the high-voltage sampling terminal is connected to the high-voltage sampling connection base, where the box further includes a second cover plate, a surface of the second housing facing away from the first housing includes a placement groove, the control board is disposed in the placement groove, and the second cover plate is mounted on the second housing to cover the placement groove; a surface of the control board facing away from the second housing is includes a control board signal connector, the second cover plate includes a signal interface, and the control board signal connector extends from the signal interface.

According to some embodiments of the present disclosure, a bracket is disposed between the drive board and the first housing, the bracket includes a signal pin column and a motor connection bar, an end of the IGBT module close to the insert-in hole includes a signal pin and an AC bar, the signal pin runs through the signal pin column and is connected to the drive board, and the AC bar is connected to the motor connection bar.

According to some embodiments of the present disclosure, the signal pin column includes a guide section, a transition section, and a connection section disposed along an axial direction of the signal pin column, the guide section is disposed at an end of the signal pin column close to the IGBT module, an inner diameter of the guide section is greater than an inner diameter of the connection section, the transition section is connected to the guide section and the connection section, and an inner diameter of the transition section gradually decreases in a direction from the guide section to the connection section.

According to some embodiments of the present disclosure, the motor controller further includes: a three-phase conductive column connected to an end of the motor connection bar away from the bracket; a three-phase adapter, the three-phase adapter is mounted on the first housing and connected to the three-phase conductive column; and a three-phase injection-molded member, the three-phase injection-molded member is connected to the three-phase adapter and a three-phase motor, a Hall element is mounted on the drive board, and the three-phase conductive column runs through the Hall element; the first housing includes a three-phase wire outlet and a three-phase wiring port, and the three-phase injection-molded member extends from the three-phase wire outlet into the first housing and is connected to the three-phase adapter.

In a second aspect, an embodiment of the present disclosure provides a vehicle, the vehicle includes the motor controller according to the embodiment of the present disclosure in the first aspect.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings.

DETAILED DESCRIPTION

Figure 1:
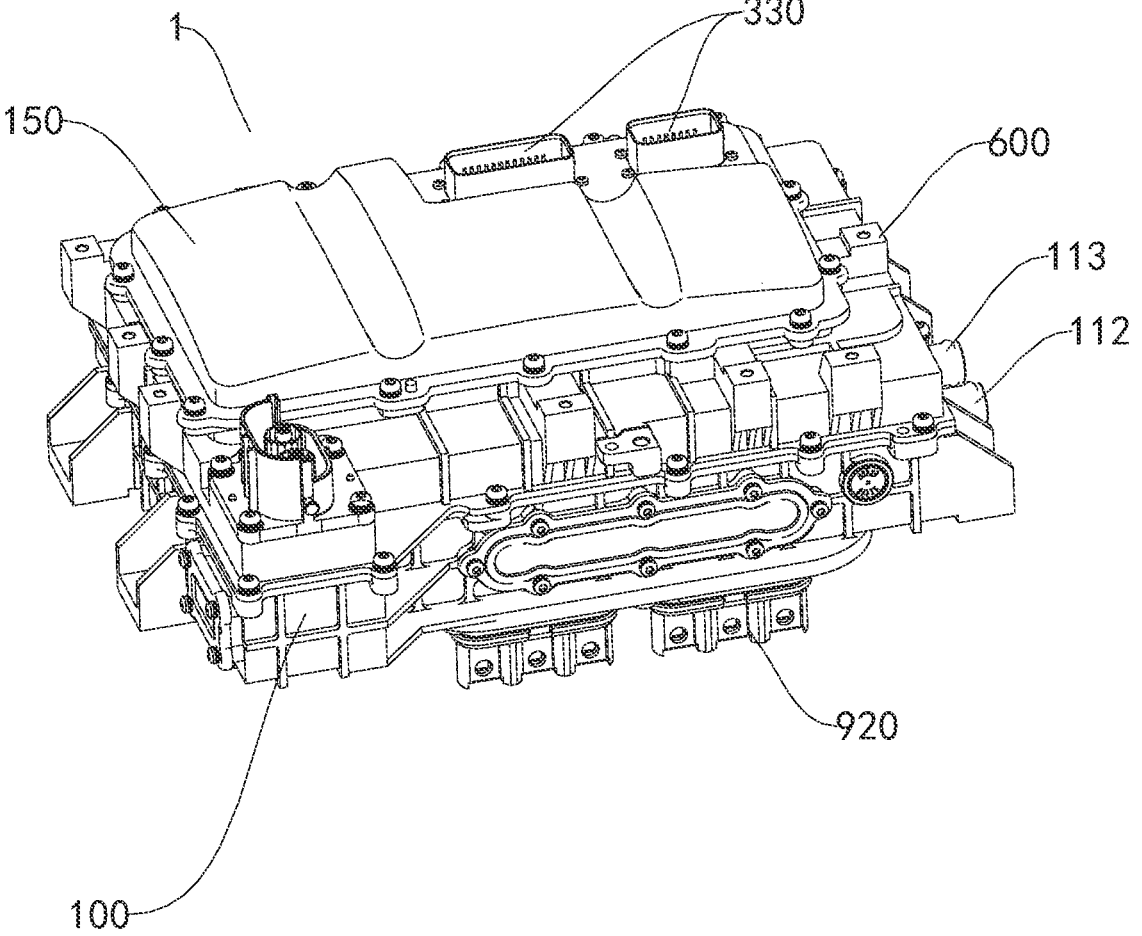
FIG. 1 is a schematic structural diagram of a motor controller according to an embodiment of the present disclosure.

The embodiments of the present disclosure will be described below in detail. Examples of the embodiments are shown in the accompanying drawings. The same or similar reference signs in all the accompanying drawings indicate the same or similar elements or elements having the same or similar functions. The embodiments described below with reference to the accompanying drawings are exemplary, and are merely to explain the present disclosure and cannot be construed as limitations to the present disclosure.

In the description of the present disclosure, it should be understood that orientation or position relationships indicated by the terms such as "center", "longitudinal", "transverse", "length", "width", "thickness", "up", "down", "front", "back", "left", "right", "vertical", "horizontal", "top", "bottom", "inside", "outside", "axial", "radial", and "circumferential" are based on orientation or position relationships shown in the accompanying drawings, and are used only for ease and brevity of illustration and description, rather than indicating or implying that the mentioned apparatus or element must have a particular orientation or must be constructed and operated in a particular orientation. Therefore, such terms should not be construed as limitations to the present disclosure.

In the description of the present disclosure, "first feature" or "second feature" may include one or more of these features.

In the description of the present disclosure, "multiple" means two or more than two, and "several" means one or more.

A motor controller 1 according to an embodiment of the present disclosure will be described below with reference to the accompanying drawings.

Referring to FIG. 1 to FIG. 8, the motor controller 1 according to the embodiment of the present disclosure includes a box 100, an IGBT module 200, a control board 300, a drive board 400, and a capacitor module 500.

The box 100 includes a first housing 110. The first housing 110 is provided with or includes a cooling chamber 130. Two opposite sidewalls of the cooling chamber 130 are respectively provided with an insert-in hole 121 and an protrude-out hole 122. The IGBT module 200 is arranged/disposed in the box 100 and inserted into the cooling chamber 130 through the insert-in hole 121. Two opposite side surfaces of a thickness direction of the IGBT module 200 and an inner wall of the cooling chamber 130 form liquid passing gaps 123. Two ends of the IGBT module 200 are sealed with the first housing 110 to seal the insert-in hole 121 and the protrude-out hole 122. The control board 300 and the drive board 400 are arranged/disposed in the box 100. The control board 300 is located on a side of the drive board 400 facing away from the IGBT module 200. The drive board 400 is connected to the control board 300 and the IGBT module 200. The capacitor module 500 is located on a side or a surface of the first housing 110 facing away from the drive board, 400. The capacitor module 500 is connected to the IGBT module 200. The capacitor module 500 dissipates heat through a coolant in the cooling chamber 130.

For example, the first housing 110 may be constructed into a cuboid or cube through die casting in combination with machining. The cooling chamber 130 may be filled with the coolant. The coolant cools the IGBT module 200 through the liquid passing gaps 123 and flows through multiple cooling chambers 130. The first housing 110 may include a metal portion. The metal portion is located between the control board 300 and the capacitor module 500.

In the motor controller 1 provided by the embodiment of the present disclosure, the first housing 110 is provided with the cooling chamber 130, two opposite sidewalls of the cooling chamber 130 are respectively provided with the insert-in hole 121 and the protrude-out hole 122, the IGBT module 200 is arranged in the box 100 and inserted into the cooling chamber 130 through the insert-in hole 121, the portion of the IGBT module 200 that needs heat dissipation is located in the cooling chamber 130 and is wrapped by the cooling chamber 130, and the two opposite side surfaces of the IGBT module 200 in the thickness direction and the inner wall of the cooling chamber 130 form the liquid passing gaps 123, so that the two opposite side surfaces of the IGBT module 200 in the thickness direction are completely immersed in the coolant, double-sided heat dissipation of the IGBT module 200 is achieved, the portion of the IGBT module 200 that needs heat dissipation has a larger contact area with the coolant, and the heat dissipation effect is good. This allows the first housing 110 to adapt to the IGBT module 200 with higher power density, thus achieving the purpose of increasing the power of the IGBT module 200.

In addition, each of two ends of the IGBT module 200 forms a sealing structure with the first housing 110, and a closed cooling water channel 131 is formed between the first housing 110 and the IGBT module 200, thus sealing the insert-in hole 121 and the protrude-out hole 122 for inserting the IGBT module 200. This ensures good sealing effect of the cooling chamber 130 and prevents the coolant from flowing out of the cooling chamber 130.

In addition, the control board 300 and the drive board 400 are arranged in the box 100. The IGBT module 200, the control board 300, and the drive board 400 may be arranged along the thickness direction of the box 100. The control board 300 is located on the side of the drive board 400 facing away from the IGBT module 200. The drive board 400 is connected to the control board 300 and the IGBT module 200, respectively. In an embodiment, one side of the drive board 400 close to the control board 300 in the thickness direction is connected to the control board 300, while another side is connected to the IGBT module 200, so that it is more convenient to connect and the internal structure of the motor controller 1 is more compact. At the same time, the cooling chamber 130 is located on a side of the drive board 400 facing away from the control board 300. Not only can the coolant in the cooling chamber 130 dissipate heat for the drive board 400, optimize the heat dissipation effect of the motor controller 1, but also the distance between the control board 300 and the IGBT module 200 is larger, which can reduce the electromagnetic interference of the IGBT module 200 on the control board 300.

In addition, the capacitor module 500 is located on a side of the first housing 110 facing away from the drive board 400, and the control board 300 is located on a side of the drive board 400 facing away from the first housing 110, that is, the capacitor module 500 and the control board 300 are located on two opposite sides of the first housing 110, so that the distance between the capacitor module 500 and the control board 300 is larger, and the first housing 110 can attenuate the electromagnetic waves emitted by the capacitor module 500 towards the direction of the control board 300, thus improving the working performance of the control board 300 and optimizing the electromagnetic compatibility (EMC) of the motor controller 1.

The capacitor module 500 is connected to the IGBT module 200. The capacitor module 500 dissipates heat through the coolant in the cooling chamber 130. The coolant can not only dissipate heat for the IGBT module 200, but also for the capacitor module 500, thus increasing the utilization rate of the coolant and further improving the heat dissipation efficiency of the motor controller 1. Since only the cooling chamber 130 that contains the coolant needs to be provided to dissipate heat for both the IGBT module 200 and the capacitor module 500, and the IGBT module 200 and the capacitor module 500 do not need to be arranged on two opposite sides of the cooling chamber 130, the space utilization rate of the motor controller 1 is improved and the miniaturization of the motor controller 1 is facilitated.

In this way, the motor controller 1 according to the embodiment of the present disclosure has the advantages of high heat dissipation efficiency, good electromagnetic compatibility, high space utilization rate, small size, and the like.

Figure 2:
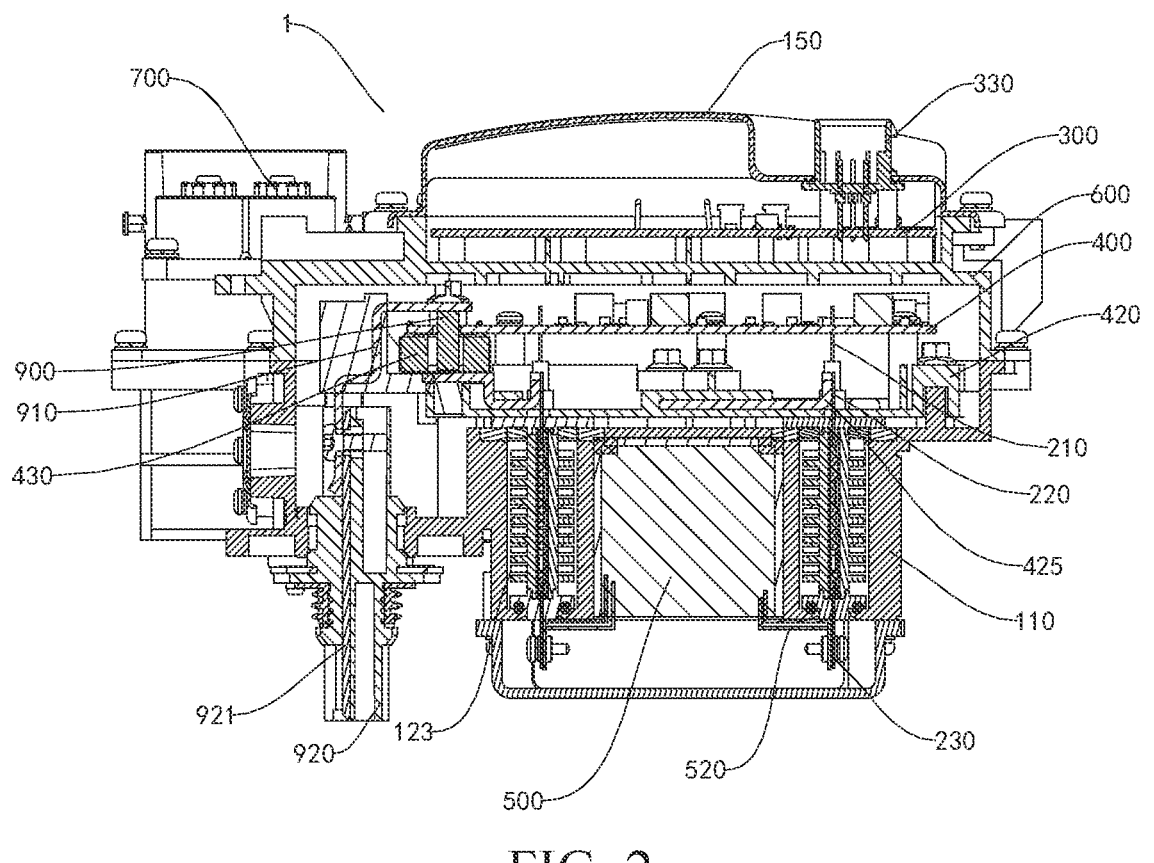
FIG. 2 is a cross-sectional view of a motor controller according to an embodiment of the present disclosure.
Figure 3:
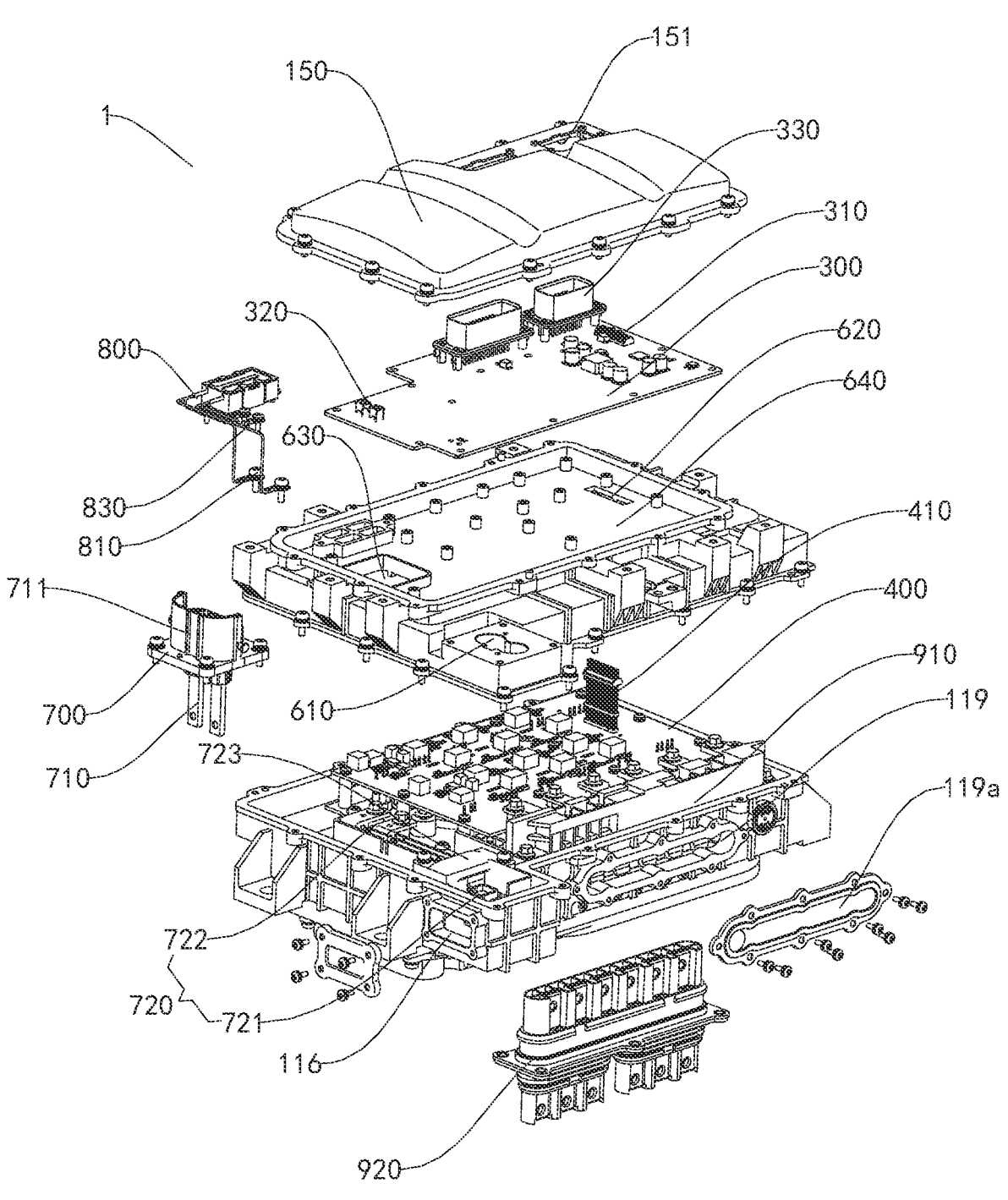
FIG. 3 is an exploded view of a motor controller according to an embodiment of the present disclosure.

According to some embodiments of the present disclosure, referring to FIG. 2 and FIG. 3, the drive board 400 and the control board 300 are arranged on a side of the first housing 110 provided with the insert-in hole 121. In this case, the control board 300 is located on the side of the drive board 400 facing away from the insert-in hole 121, and the capacitor module 500 is located on a side of the first housing 110 provided with the protrude-out hole 122.

Since the IGBT module 200 is inserted into the cooling chamber 130 through the insert-in hole 121, it is more convenient for the IGBT module 200 to detach from the cooling chamber 130 through the insert-in hole 121. By configuring the drive board 400 and the control board 300 on the side of the first housing 110 provided with the insert-in hole 121, the control board 300, the drive board 400, and the IGBT module 200 can be sequentially disassembled and assembled from the side of the first housing 110 provided with the insert-in hole 121 when the motor controller 1 is disassembled and assembled, so that the above-mentioned devices do not need to be disassembled and assembled from the two sides of the first housing 110, thus improving the convenience in disassembly and assembly.

Figure 5:
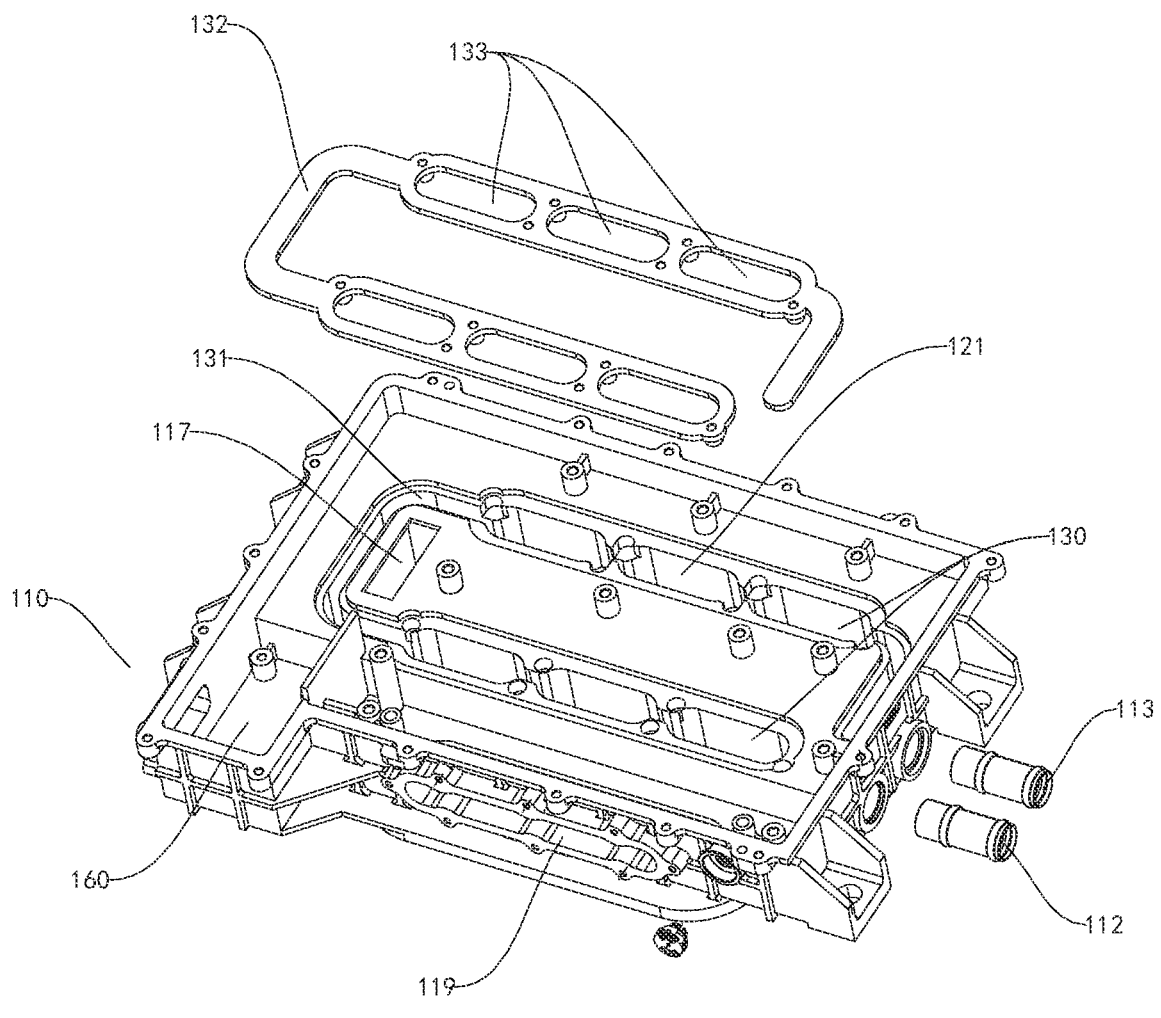
FIG. 5 is an exploded view of a first housing and a water channel cover plate of a motor controller according to an embodiment of the present disclosure.
Figure 6:
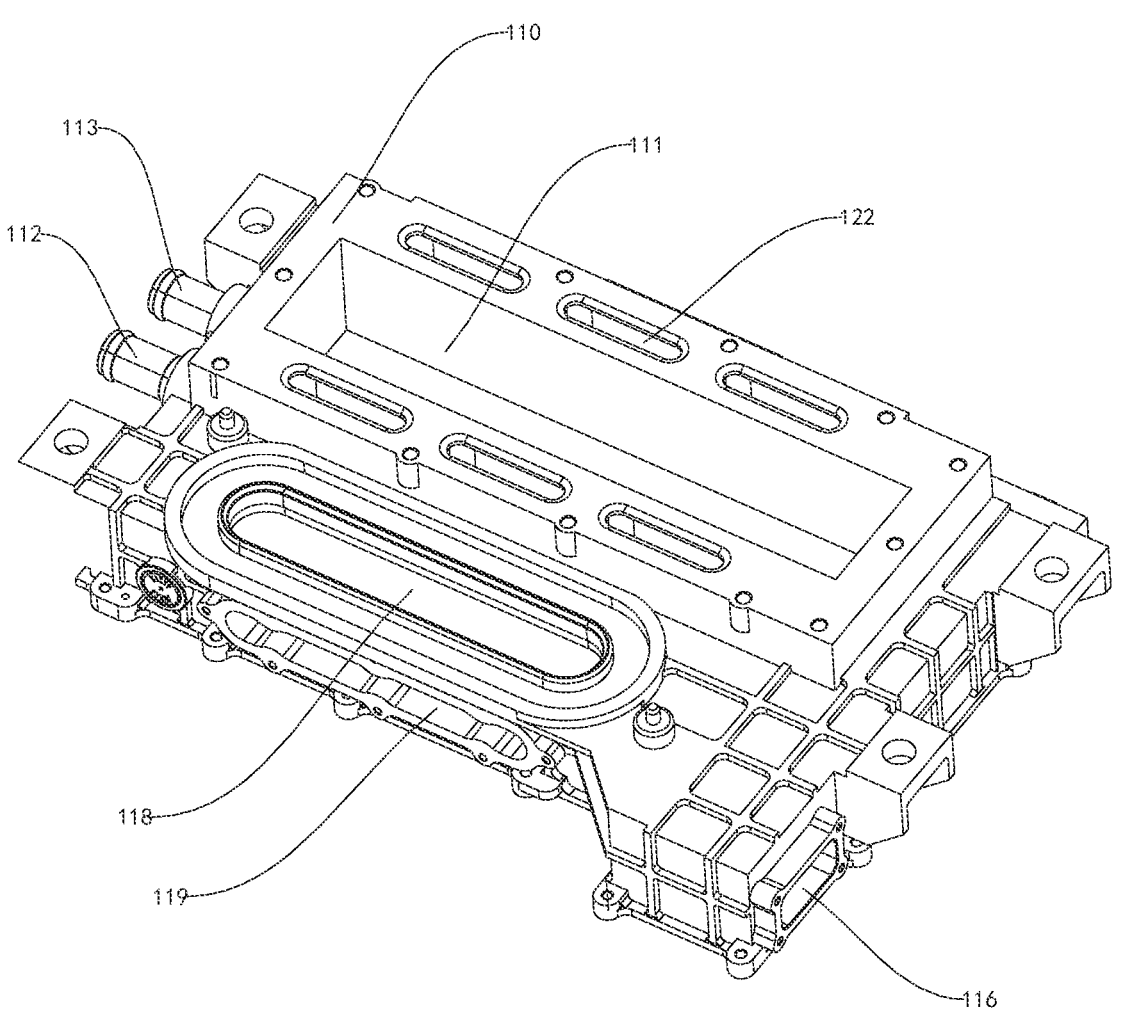
FIG. 6 is a schematic structural diagram of a first housing of a motor controller according to an embodiment of the present disclosure.
Figure 7:
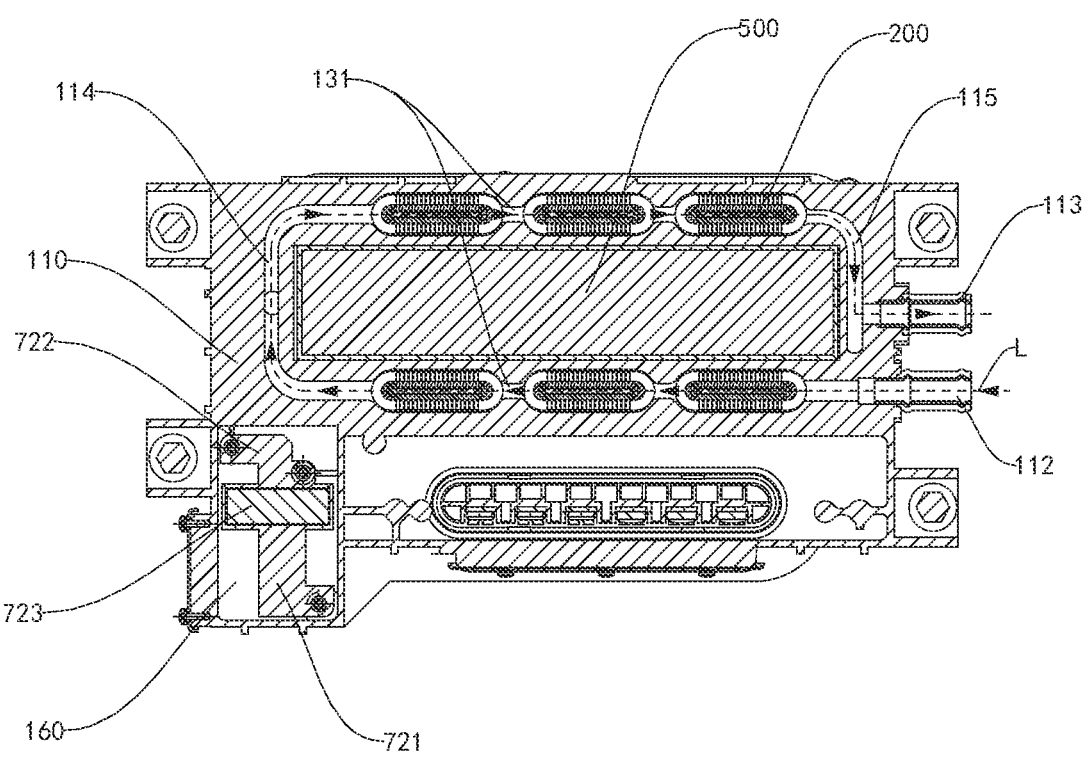
FIG. 7 is a cross-sectional view of a first housing of a motor controller according to an embodiment of the present disclosure.

According to some embodiments of the present disclosure, referring to FIG. 5 to FIG. 7, the multiple cooling chambers 130 and an accommodating groove 111 are defined in the first housing 110.

The multiple cooling chambers 130 are arranged/disposed as at least two rows of cooling water channels 131 spaced apart, and the accommodating groove 111 is located between adjacent rows of cooling water channels 131, so that the structure is more compact and the volume miniaturization of the motor controller 1 is facilitated. Multiple IGBT modules 200 are arranged and correspond to the multiple cooling chambers 130 one to one. Each of the IGBT modules 200 is inserted into the corresponding cooling chamber 130 through the corresponding insert-in hole 121. The capacitor module 500 is mounted in the accommodating groove 111.

For example, the motor controller 1 can simultaneously control two motors (for example, a drive motor and a power generator), the multiple IGBT modules 200 in the one of the two rows of cooling water channels 131 can control one motor, and the multiple IGBT modules 200 in the other of the two rows of cooling water channels 131 can control another motor. The drive boards 400 of the above two motors are integrated into one circuit board to save the space.

When the coolant passes through the cooling water channels 131 to dissipate heat from the IGBT module 200, it will flow through the two opposite sides of the accommodating groove 111, that is, the coolant will exchange heat with two sides of the capacitor module 500 in the thickness direction. The capacitor module 500 also achieves double-sided heat dissipation. There is a larger contact area between the coolant and the capacitor module 500, thus improving the heat dissipation effect of the capacitor module 500. Moreover, in a case that the heat dissipation effect of the capacitor module 500 is improved, the volume, weight, and cost of the capacitor module 500 are reduced, thus achieving the advantages such as a more compact structure.

In addition, a groove opening of the accommodating groove 111 faces away from the drive board 400, that is, there is a groove wall of the accommodating groove 111 on a side of the accommodating groove 111 close to the drive board 400 to separate the drive board 400 from the control board 300, thus achieving a better shielding effect between the capacitor module 500 and the control board 300. Moreover, since the groove opening of the accommodating groove 111 faces away from the drive board 400, when the capacitor module 500 is disassembled and assembled through the accommodating groove 111, there is no need to first disassemble the drive board 400 and the control board 300. The drive board 400 and the control board 300 will not influence the disassembly and assembly of the capacitor module 500, thus facilitating the disassembly and assembly of the capacitor module 500.

According to some embodiments of the present disclosure, referring to FIG. 5 to FIG. 7, the multiple cooling chambers 130 are arranged as two rows of cooling water channels 131, and the first housing 110 is provided with a liquid inlet 112, a liquid outlet 113, a first communicating water channel 114, and a second communicating water channel 115.

Two ends of the first communicating water channel 114 are respectively in communication with corresponding one ends (e.g., first ends) of the two rows of cooling water channels 131. The second communicating water channel 115 is in communication with another end (e.g., a second end) of the one (e.g., a first one) of the two rows of cooling water channels 131. One of the liquid inlet 112 and the liquid outlet 113 is in communication with another end of the other of the two rows of cooling water channels 131. The other of the liquid inlet 112 and the liquid outlet 113 is in communication with the second communicating water channel 115. The second communicating water channel 115, the one of the two rows of cooling water channels 131, the first communicating water channel 114, and the other one (e.g., a second one) of the two rows of cooling water channels 131 are sequentially in communication and surround the accommodating groove 111. In this way, the capacitor module 500 dissipates heat on its multiple circumferential surfaces, thus achieving a better heat dissipation effect.

For example, the liquid outlet 113 may be in communication with the second communicating water channel 115, the liquid inlet 112 may be in communication with another end of the other of the two rows of cooling water channels 131, and the first communicating water channel 114 may be constructed into a U-shaped shape in its extension direction, so as to facilitate the connection of the first communicating water channel 114 to two rows of cooling water channels 131. At the same time, since the first communicating water channel 114 has no bends on the whole, the flow of the coolant in the cooling water channels 131 is smoother.

In addition, the liquid outlet 113 may correspond to the other of the two rows of cooling water channels 131 in the width direction of the first housing 110, and the second communicating water channel 115 may be bent from one end of the one of the two rows of cooling water channels 131 towards a direction close to the liquid inlet 112, thus making the liquid outlet 113 closer to the liquid inlet 112, that is, the distance between the second communicating water channel 115 and the other of the two rows of cooling water channels 131 is smaller. The second communicating water channel 115, the one of the two rows of cooling water channels 131, the first communicating water channel 114, and the other of the two rows of cooling water channels 131 can better surround the accommodating groove 111 in the circumferential direction of the accommodating groove 111, thus more sufficiently cooling the capacitor module 500 in the accommodating groove 111.

Referring to FIG. 7, a flow route L of the coolant will be exemplarily described below.

Firstly, the coolant enters through the liquid inlet 112, sequentially flows through the multiple cooling chambers 130 from one end of one cooling water channel 131 connected to the liquid inlet 112, and dissipates heat from the IGBT module 200 in each of the cooling chambers 130.

Then, the coolant flows into the first communicating water channel 114 from an end of the cooling water channel 131 away from the liquid inlet 112, flows into another adjacent cooling water channel 131 through the first communicating water channel 114, sequentially flows through the multiple cooling chambers 130 from an end of another cooling water channel 131 away from the liquid inlet 112, and dissipates heat from the IGBT module 200 in each of the cooling chambers 130.

Next, the coolant flows into the second communicating water channel 115 from an end of another cooling water channel 131 close to the liquid outlet 113.

Finally, the coolant flows into the liquid outlet 113 through the second communicating water channel 115 and then is discharged.

In the above process, the coolant dissipates heat from the IGBT modules 200 in the multiple cooling chambers 130 and from the capacitor module 500 in the accommodating groove 111.

According to some embodiments of the present disclosure, referring to FIG. 5, the motor controller 1 further includes a water channel cover plate 132. The first communicating water channel 114 and the second communicating water channel 115 are open on a side (e.g., a first surface) of the first housing 110 provided with the insert-in hole 121. The water channel cover plate 132 is mounted on the side of the first housing 110 provided the insert-in hole 121 and covers the at least two rows of cooling water channels 131, the first communicating water channel 114, and the second communicating water channel 115. The water channel cover plate 132 is provided with multiple through holes 133. The multiple IGBT modules 200 correspondingly run through the multiple through holes 133 one to one.

For example, the water channel cover plate 132 may be welded to the side of the first housing 110 provided with the insert-in hole 121 (for example, through friction welding) to make the water channel cover plate 132 integral with the first housing 110. The water channel cover plate 132 may be used for closing the first communicating water channel 114 and the second communicating water channel 115, so as to prevent the coolant from being exposed from the first communicating water channel 114 and the second communicating water channel 115. Moreover, the cross-sectional shape of the through hole 133 of the water channel cover plate 132 may be the same as the cross-sectional shape of the insert-in hole 121. The multiple through holes 133 correspond to multiple insert-in holes 121 one to one. Each of the IGBT modules 200 runs through the corresponding through hole 133 and the insert-in hole 121 to enter the corresponding cooling chamber 130.

In order to ensure the communication between adjacent cooling chambers 130, it is necessary to configure the first communicating water channel 114 and the second communicating water channel 115. Moreover, in order to allow the IGBT module 200 to be inserted into the cooling chamber 130, two ends of the cooling chamber 130 need to be open. Therefore, the first communicating water channel 114 and the second communicating water channel 115 are open on the side of the first housing 110 provided with the insert-in hole 121, thus simplifying the processing technology of the first communicating water channel 114, the second communicating water channel 115, and the cooling chamber 130, and reducing the overall processing difficulty. Moreover, by adding the water channel cover plate 132, the sealing performance of the first communicating water channel 114 and the second communicating water channel 115 can be ensured while reducing the process difficulty.

According to some embodiments of the present disclosure, referring to FIG. 3, the box 100 further includes a first cover plate 140. The first cover plate 140 is mounted on the first housing 110. The first cover plate 140 covers the accommodating groove 111.

In an embodiment, the first cover plate 140 may be connected to the side of the first housing 110 facing away from the drive board 400 through threaded fasteners. By using the first cover plate 140 to cover the accommodating groove 111, the capacitor module 500 will not detach from the groove opening of the accommodating groove 111, so that the mounting and fixation of the capacitor module 500 are more reliable. At the same time, the entire capacitor module 500 is covered by the first housing 110 and the first cover plate 140, so that the capacitor module 500 has less electromagnetic interference to the outside world, and the overall shielding effect of the motor controller 1 is better.

Figure 4:
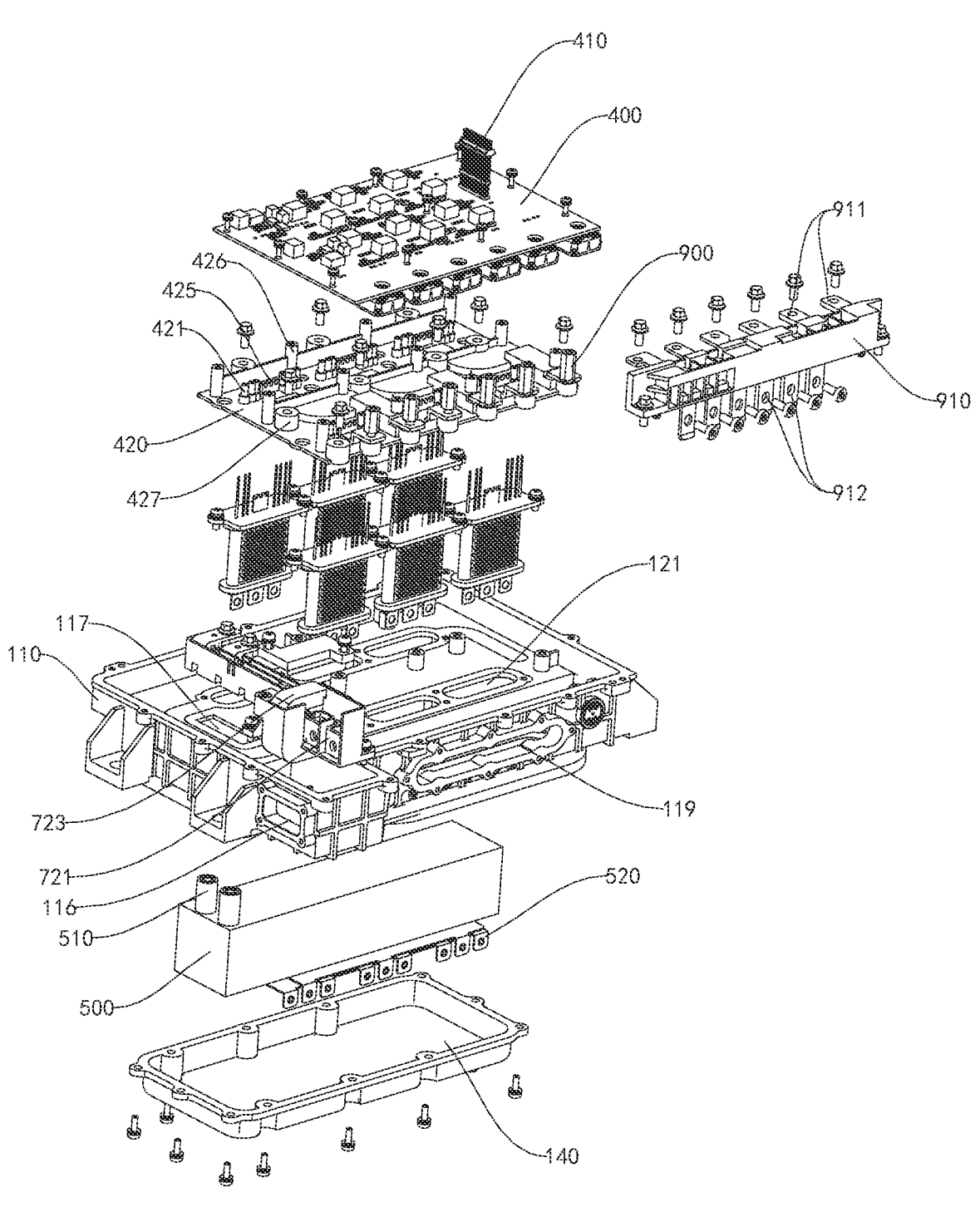
FIG. 4 is another exploded view of a motor controller according to an embodiment of the present disclosure.

According to some embodiments of the present disclosure, referring to FIG. 2 to FIG. 4, the box 100 further includes a second housing 600. The second housing 600 is mounted on the first housing 110. The drive board 400 is located between the second housing 600 and the first housing 110. The control board 300 is located on a side of the second housing 600 facing away from the first housing 110. The second housing 600 may include a metal portion. The metal portion is located between the drive board 400 and the control board 300.

By separately disposing the drive board 400 and the control board 300 on two opposite sides of the second housing 600, the second housing 600 can separate the control board 300 from the drive board 400, the IGBT module 200, and the capacitor module 500, thus reducing the electromagnetic interference of the drive board 400, the IGBT module 200, and the capacitor module 500 on the control board 300, and ensuring the reliability of signal transmission by the control board 300.

According to some embodiments of the present disclosure, referring to FIG. 2 to FIG. 4, the motor controller 1 further includes a DC connector 700, a DC adapter 720, and a magnetic ring 723.

The DC connector 700 is mounted on a side of the first housing 110 facing to the second housing 600. The first housing 110 is provided with a bus interface 116 for exposing the DC connector 700. The DC adapter 720 is mounted on the side of the first housing 110 facing to the second housing 600. A DC input end 721 of the DC adapter 720 is connected to the DC connector 700. A DC output end 722 of the DC adapter 720 is connected to the capacitor module 500.

According to some embodiments of the present disclosure, the second housing 600 is provided with a fixing hole 610, the DC connector 700 is provided with a DC bar 710 and a DC connection portion 711, the DC bar 710 runs through the fixing hole 610 and is fixed to the second housing 600, and the DC bar 710 is connected to the DC input end 721 of the DC adapter 720.

In an embodiment, the fixing hole 610 may run through the first housing 110 along the thickness direction of the first housing 110. The DC bar 710 is inserted into the fixing hole 610 from the side of the second housing 600 facing away from the first housing 110, and is exposed from the side of the second housing 600 facing to the first housing 110. The DC bar 710 is connected to the DC input end 721 from the bus interface 116 through threaded fasteners. The fixing hole 610 can position the DC connector 700, so that the relative position between the DC connector 700 and the second housing 600 is fixed. Moreover, the DC connection portion 711 is located on the side of the second housing 600 facing away from the first housing 110. The DC connection portion 711 is connected to an external power supply.

In this way, it is convenient to achieve electrical conduction between the DC connector 700, the DC adapter 720, and the external power supply. That is, the current from the external power supply can be output to the capacitor module 500 through the DC connector 700 and the DC adapter 720 to charge the capacitor module 500.

Moreover, the magnetic ring 723 is mounted on the DC adapter 720 and located between the DC input end 721 and the DC output end 722. By additionally disposing the magnetic ring 723, the high-frequency noise produced during the flow of the current of the external power supply to the capacitor module 500 can be effectively suppressed. The DC adapter 720 can not only be used for conducting the DC connector 700 and the capacitor module 500, but also provide a mounting support for the magnetic ring 723, thus helping the current input into the capacitor module 500 to run through the magnetic ring 723.

According to some embodiments of the present disclosure, referring to FIG. 4, the capacitor module 500 is mounted on a side (e.g., a second surface) of the first housing 110 facing away from the second housing 600 and provided with a capacitor input end 510 and a capacitor output end 520, the first housing 110 is provided with a DC via 117, the capacitor input end 510 runs through the DC via 117 and is connected to the DC output end 722 of the DC adapter 720, an end of the IGBT module 200 close to the protrude-out hole 122 is provided with an IGBT input end 230, and the IGBT input end 230 extends out of the protrude-out hole 122 and is connected to the capacitor output end 520. For example, the IGBT input end 230 and the capacitor output end 520 may be connected through welding or fasteners.

For example, the capacitor input end 510 is connected and conducted to the DC output end 722. The current of the external power supply flows through the DC output end 722 of the DC adapter 720 to the capacitor input end 510 and then is stored in the capacitor module 500. The electric energy stored in the capacitor module 500 is then input from the capacitor output end 520 to the IGBT module 200. The IGBT module 200 converts the input DC power into three-phase AC power and outputs it.

By communicating the IGBT module 200 with the external power supply through the capacitor module 500, the voltage fluctuation of the external power supply can be prevented from influencing the IGBT module 200, thus ensuring that the voltage received by the IGBT module 200 remains stable, avoiding the damage to the IGBT module 200, and prolonging the service life of the IGBT module 200.

The capacitor input end 510 may be arranged/disposed on a side of the capacitor module 500 facing to the first housing 110. The distance between the capacitor input end 510 and the DC output end 722 is smaller, thus helping the capacitor input end 510 to run through the DC via 117 and connect to the DC output end 722. The capacitor output end 520 is arranged/disposed on a side of the capacitor module 500 facing away from the first housing 110. The IGBT input end 230 extends out from the protrude-out hole 122. The capacitor output end 520 and the IGBT input end 230 are located on the same side of the first housing 110, thus making the connection more convenient.

According to some embodiments of the present disclosure, referring to FIG. 5 and FIG. 7, a DC shielding cavity 160 is arranged/formed in the side of the first housing 110 facing to the second housing 600. The DC connector 700, the DC input end 721 of the DC adapter 720, and the magnetic ring 723 are arranged/disposed in the DC shielding cavity 160. The bus interface 116 runs through a sidewall of the DC shielding cavity 160.

In an embodiment, the DC shielding cavity 160 and the DC adapter 720 are located on the same side of the length direction of the cooling water channels 131, while the liquid inlet 112 and the liquid outlet 113 are located in another side of the length direction of the cooling water channels 131. After placing the DC connector 700 and the DC input end 721 into the DC shielding cavity 160, the DC connector 700 and the DC input end 721 may be connected from the bus interface 116 through threaded fasteners. The DC shielding cavity 160 can not only fix the positions of the DC connector 700, the DC input end 721, and the magnetic ring 723 and facilitate the connection between the external power supply and the DC connector 700, but also better electromagnetically shield the input current and optimize the electromagnetic compatibility of the motor controller 1.

According to some embodiments of the present disclosure, referring to FIG. 2 and FIG. 3, the second housing 600 is provided with a signal via 620. The signal via 620 runs through the second housing 600 along the thickness direction of the second housing 600. The drive board 400 is provided with a drive board signal pin 410. The drive board signal pin 410 is located on a side of the drive board 400 facing to the control board 300 and extends towards the direction of the control board 300. The control board 300 is provided with a signal pin socket 310. The drive board signal pin 410 runs through the signal via 620 and is inserted into the signal pin socket 310.

In this way, the signal via 620 can achieve a pre-positioning effect on the drive board signal pin 410, so as to facilitate the connection between the drive board signal pin 410 and the signal pin socket 310. By connecting the drive board signal pin 410 and the signal pin socket 310, the drive board 400 can transmit three-phase voltage and current parameters of the motor to the control board 300, helping the vehicle center controller to control the drive board 400 through the control board 300 according to the actual situation.

According to some embodiments of the present disclosure, referring to FIG. 2 and FIG. 3, the motor controller 1 further includes a discharge resistor 800 and a high-voltage sampling terminal 830. The discharge resistor 800 includes a connection end 810. The second housing 600 is provided with a discharge via 630. The connection end 810 runs through the discharge via 630 and is connected to the capacitor module 500. The discharge resistor 800 and the capacitor module 500 form a conductive loop. The high-voltage sampling terminal 830 is connected in parallel with the discharge resistor 800. The control board 300 is provided with a high-voltage sampling connection base 320. The high-voltage sampling terminal 830 is connected to the high-voltage sampling connection base 320.

In an embodiment, the connection end 810 is directly connected to the DC input end 721. The connection end 810 is connected in parallel with the capacitor module 500 through the DC input end 721 to form a conductive loop. When the motor controller 1 is not in a working state, the capacitor module 500 may store electrical energy. The electric energy stored in the capacitor module 500 can be discharged in a timely manner through the conductive loop to avoid safety hazards and improve safety. The control board 300 controls the stability of the current input from the external power supply to the capacitor module 500 through the high-voltage sampling terminal 830.

According to some embodiments of the present disclosure, referring to FIG. 1 to FIG. 3, the box 100 further includes a second cover plate 150. The side of the second housing 600 facing away from the first housing 110 is provided with a placement groove 640. The control board 300 is arranged in the placement groove 640. The second cover plate 150 is mounted on the second housing 600 to cover the placement groove 640.

The placement groove 640 is located on the side of the second housing 600 facing away from the first housing 110, and the placement groove 640 is recessed towards the direction close to the first housing 110 to form a space for accommodating the control board 300. By configuring the placement groove 640, the pre-positioning of the control board 300 and the second housing 600 can be achieved, and it is more convenient to mount. At the same time, the second cover plate 150 covers the placement groove 640, and the second housing 600 and the second cover plate 150 cover the control board 300, thus reducing the volume of the portion of the control board 300 that is exposed to the air and protecting the control board 300 more reliably.

According to some embodiments of the present disclosure, referring to FIG. 1 to FIG. 3, a side/surface of the control board 300 facing away from the second housing 600 is provided with a control board signal connector 330. The second cover plate 150 is provided with a signal interface 151. The control board signal connector 330 extends from the signal interface 151.

For example, the number of the control board signal connectors 330 is two. The control board signal connectors 330 are located on the side of the control board 300 facing away from the second housing 600. The control board signal connectors 330 extend towards the direction of the second cover plate 150. The signal interfaces 151 run through the second cover plate 150 along the thickness direction of the second cover plate 150. The number of the signal interfaces 151 is two. The two signal interfaces 151 correspondingly extend out of the two control board signal connectors 330. The control board 300 can be connected to other electrical components of the vehicle through the control board signal connectors 330.

Figure 8:
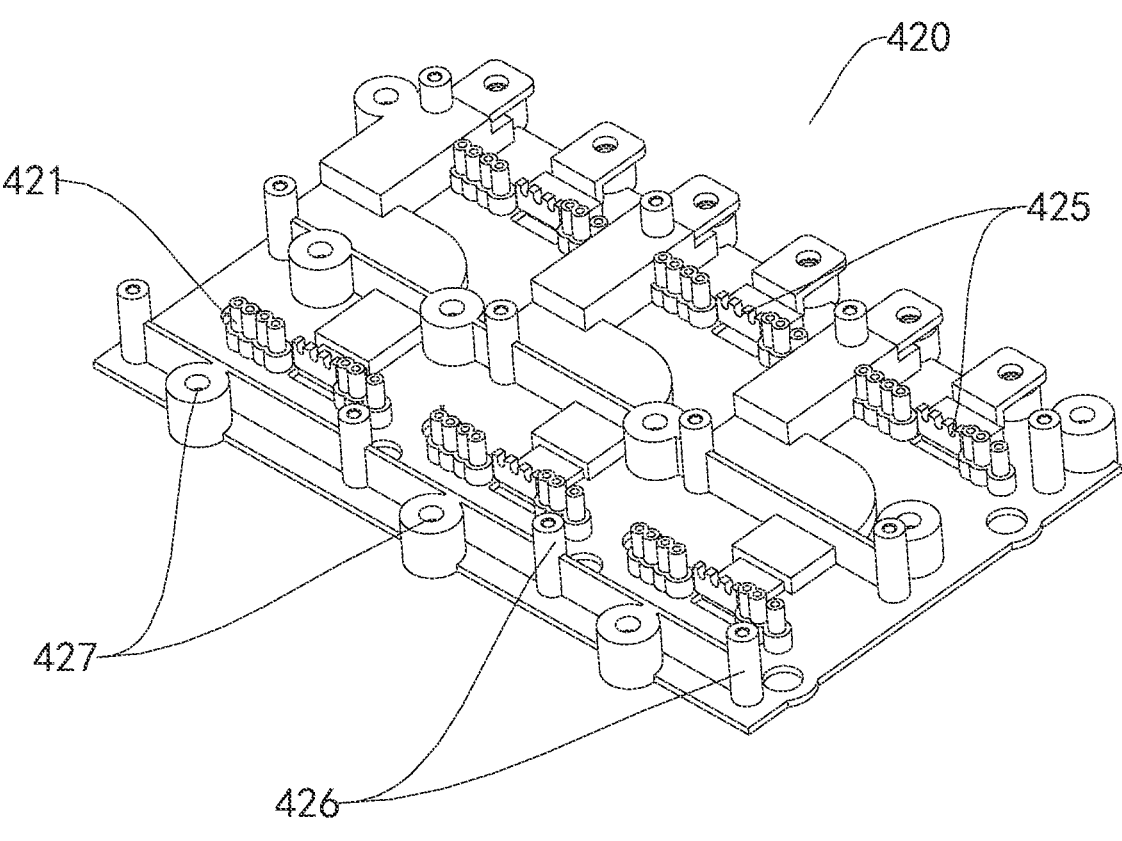
FIG. 8 is a schematic structural diagram of a bracket of a motor controller according to an embodiment of the present disclosure.

According to some embodiments of the present disclosure, referring to FIG. 2, FIG. 4, and FIG. 8, a bracket 420 is arranged/disposed between the drive board 400 and the first housing 110. The bracket 420 is provided with a signal pin column 421 and a motor connection bar 425. An end of the IGBT module 200 close to the insert-in hole 121 is provided with a signal pin 210 and an AC bar 220. The signal pin 210 runs through the signal pin column 421 and is connected to the drive board 400. The AC bar 220 is connected to the motor connection bar 425.

Multiple motor connection bars 425 are arranged/disposed. Multiple motor connection bars 425 are correspondingly connected to the multiple IGBT modules 200 one to one.

For example, the motor connection bars 425 and the AC bars 220 may be welded. A side of the bracket 420 facing to the drive board 400 is provided with multiple supporting columns 426 and fixing columns 427 spaced apart. The multiple supporting columns 426 protrude from the surface of the bracket 420 facing to the drive board 400 to support the drive board 400. The bracket 420 is mounted on the first housing 110 through the fixing columns 427.

In this way, the bracket 420 can not only support the drive board 400, but also facilitate the assembly of the signal pin 210 by configuring the signal pin columns 421 and the motor connection bars 425 on the bracket 420, thus making the distance between the signal pins 210 and the motor connection bars 425 large enough, and achieving a good insulation effect and higher safety.

Figure 10:
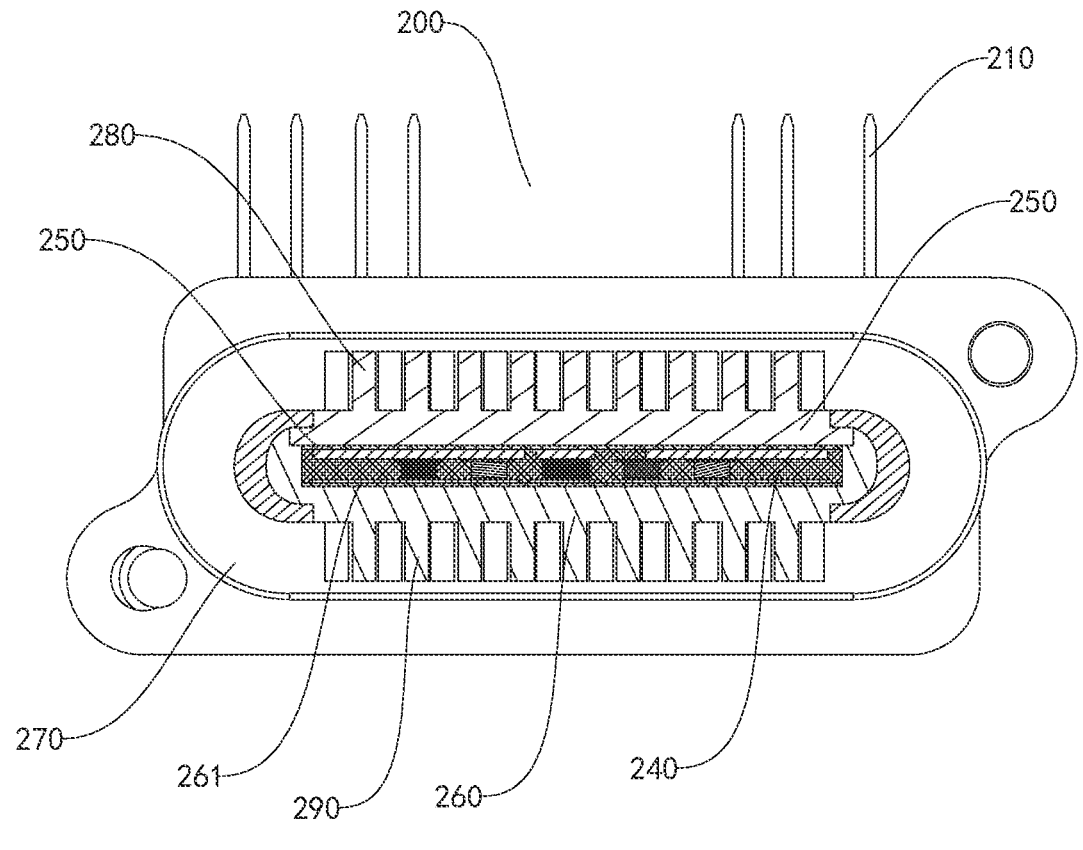
FIG. 10 is a schematic structural diagram of an IGBT module of a motor controller according to an embodiment of the present disclosure.
Figure 11:
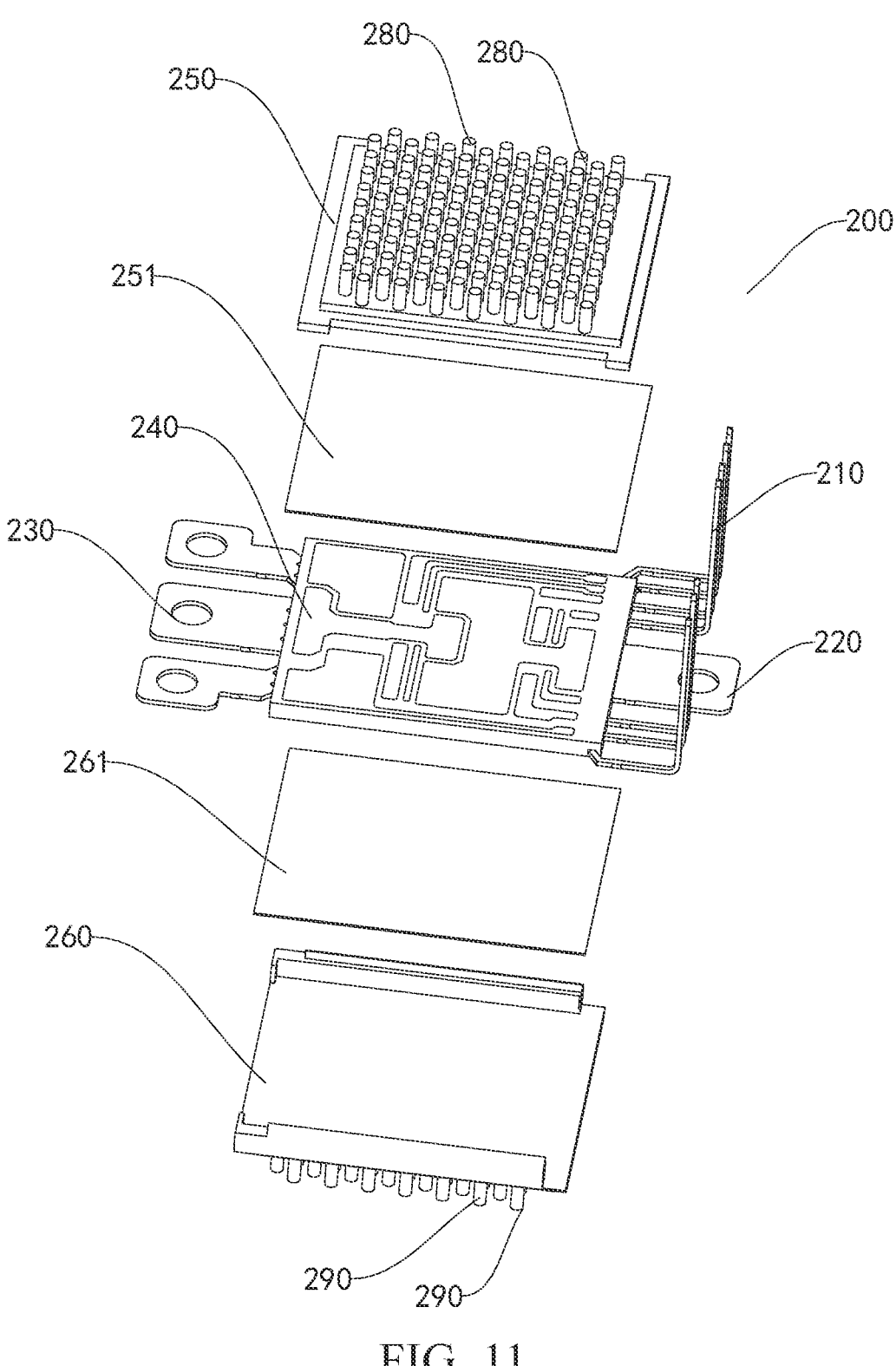
FIG. 11 is an exploded view of an IGBT module of a motor controller according to an embodiment of the present disclosure.

Moreover, referring to FIG. 10 to FIG. 11, the IGBT module 200 may include a wafer assembly 240, a first heat dissipation plate 250, a second heat dissipation plate 260, and an insulated waterproof housing 270. The first heat dissipation plate 250 and the second heat dissipation plate 260 are respectively arranged/disposed on two sides of the wafer assembly 240 in the thickness direction. A side of the first heat dissipation plate 250 facing away from the second heat dissipation plate 260 is provided with multiple first heat dissipation pins 280 spaced apart. A side of the second heat dissipation plate 260 facing away from the first heat dissipation plate 250 is provided with multiple second heat dissipation pins 290 spaced apart. The insulated waterproof housing 270 wraps a portion of the wafer assembly 240 exposed from the first heat dissipation plate 250 and the second heat dissipation plate 260.

According to some embodiments of the present disclosure, the insulated waterproof housing 270 may be a plastic member, and the insulated waterproof housing 270 may be formed by injection molding. Moreover, the insulated waterproof housing 270 may be connected to the portion of the first heat dissipation plate 250 without the first heat dissipation pins 280 and the portion of the second heat dissipation plate 260 without the second heat dissipation pins 290. The insulated waterproof housing 270 at least wraps the portion of the wafer assembly 240 exposed from the first heat dissipation plate 250 and the second heat dissipation plate 260.

In this way, through the first heat dissipation plate 250 and the second heat dissipation plate 260, the wafer assembly 240 can achieve double-sided heat dissipation, that is, the heat produced by the wafer assembly 240 can be quickly dissipated through the first heat dissipation plate 250 and the second heat dissipation plate 260, thus achieving a good heat dissipation effect. Moreover, configuring the multiple first heat dissipation pins 280 and the multiple second heat dissipation pins 290 can further increase the contact area between the IGBT module 200 and the coolant, thus further improving the heat dissipation efficiency of the IGBT module 200.

In addition, the insulated waterproof housing 270 wraps the portion of the wafer assembly 240 exposed from the first heat dissipation plate 250 and the second heat dissipation plate 260. For example, the first heat dissipation plate 250 and the second heat dissipation plate 260 can wrap two opposite sides of the wafer assembly 240 in the thickness direction, and the insulated waterproof housing 270 can wrap the circumferential sides of the wafer assembly 240, thus improving the sealing performance of the IGBT module 200, further improving the waterproof performance of the IGBT module 200, and improving the reliability of the electrical connection of the IGBT module 200. Moreover, the insulated waterproof housing 270 can be connected to the wafer assembly 240, the first heat dissipation plate 250, and the second heat dissipation plate 260, thus improving the stability of the relative positions of the wafer assembly 240, the first heat dissipation plate 250, and the second heat dissipation plate 260.

Both the first heat dissipation plate 250 and the second heat dissipation plate 260 may be metal members. The metal members can shield the electromagnetic interference caused by the high current during the operation of the wafer assembly 240, thus helping to improve the EMC (electromagnetic compatibility) effect. In this case, a first insulated heat conduction sheet 251 is arranged/disposed between the first heat dissipation plate 250 and the wafer assembly 240, and a second insulated heat conduction sheet 261 is arranged/disposed between the second heat dissipation plate 260 and the wafer assembly 240. For example, the first insulated heat conduction sheet 251 and the second insulated heat conduction sheet 261 are respectively located on two opposite sides of the wafer assembly 240 in the thickness direction. The first heat dissipation plate 250 and one side of the wafer assembly 240 in the thickness direction clamp the first insulated heat conduction sheet 251, and the second heat dissipation plate 260 and another side of the wafer assembly 240 in the thickness direction clamp the second insulated heat conduction sheet 261.

In this way, the first insulated heat conduction sheet 251 can prevent the wafer assembly 240 from being electrically conducted with the first heat dissipation plate 250, while guiding the heat on one side of the wafer assembly 240 in the thickness direction to the first heat dissipation plate 250 for heat dissipation, and the second insulated heat conduction sheet 261 can prevent the wafer assembly 240 from being electrically conducted with the second heat dissipation plate 260, while guiding the heat on another side of the wafer assembly 240 in the thickness direction to the second heat dissipation plate 260 for heat dissipation, so that both the electrical connection safety and the heat dissipation efficiency are considered.

The wafer assembly 240, the first heat dissipation plate 250, and the second heat dissipation plate 260 of the IGBT module 200 are located in the cooling chamber 130 and are wrapped by the cooling chamber 130. In this way, the first heat dissipation plate 250 and the second heat dissipation plate 260 are respectively arranged at two ends of the IGBT module 200, and both the first heat dissipation plate 250 and the second heat dissipation plate 260 can be located outside the insulated waterproof housing 270, thus not only avoiding mutual interference between the first heat dissipation plate 250 and the second heat dissipation plate 260, and helping to improve the EMC (electromagnetic compatibility) effect, but also facilitating electrical connection between the wafer assembly 240 and other electrical components of the vehicle.

Figure 9:
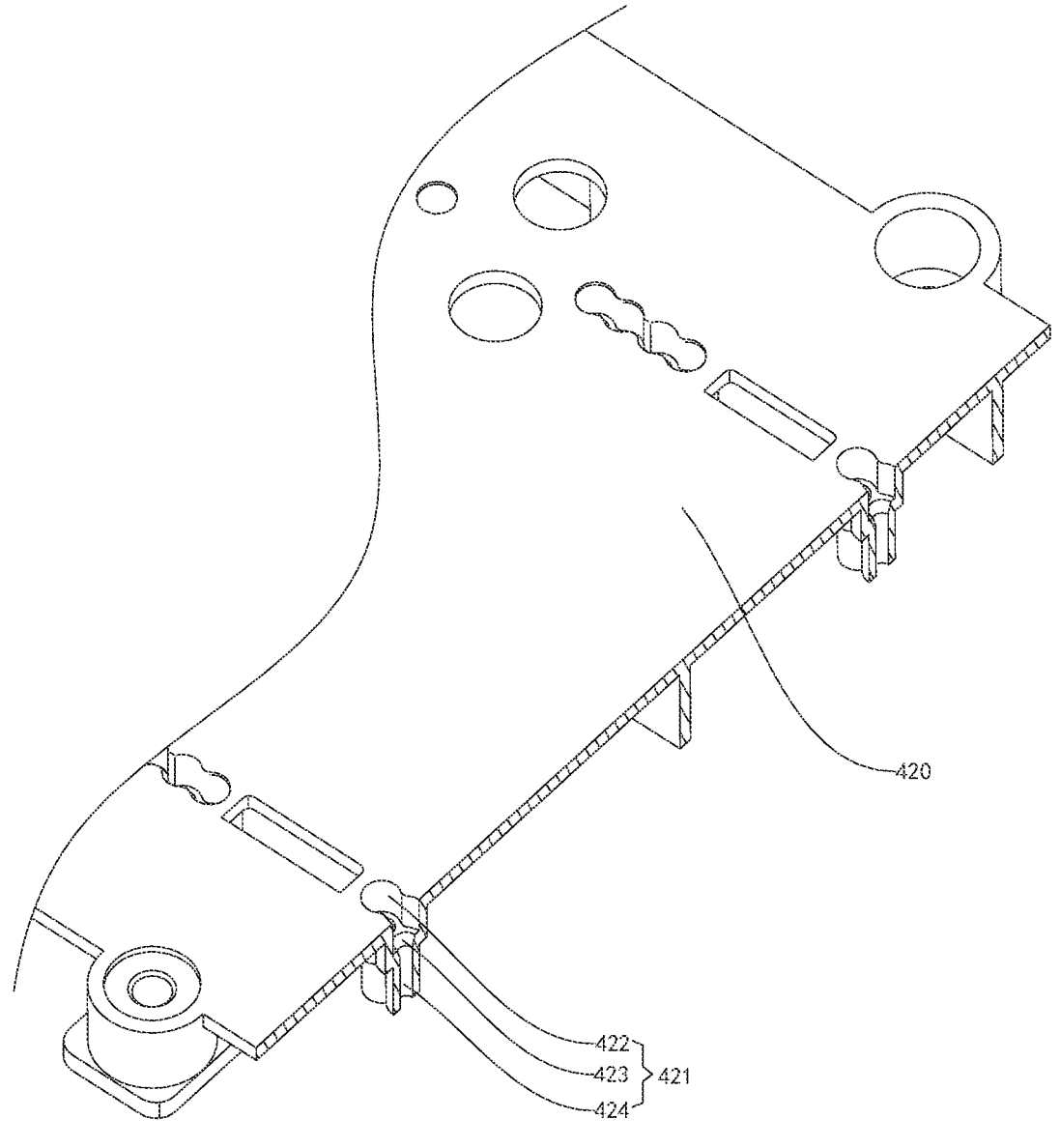
FIG. 9 is a cross-sectional view of a bracket of a motor controller according to an embodiment of the present disclosure.

According to some embodiments of the present disclosure, referring to FIG. 9, the signal pin column 421 includes a guide section 422, a transition section 423, and a connection section 424 arranged/disposed sequentially along an axial direction of the signal pin column.

The guide section 422 is arranged at an end of the signal pin column 421 close to the IGBT module 200. An inner diameter of the guide section 422 is greater than an inner diameter of the connection section 424. By setting the inner diameter of the guide section 422 large enough, it is easy to guide the signal pin 210 into the signal pin column 421, thus reducing the connection difficulty.

The transition section 423 is connected to the guide section 422 and the connection section 424, respectively. An inner diameter of the transition section 423 gradually decreases in the direction from the guide section 422 to the connection section 424. The inner wall surface of the transition section 423 is a smooth surface, so as to improve the smoothness of the movement of the signal pin 210 in the signal pin column 421. The difference between the inner peripheral diameter of the connection section 424 and the diameter of the signal pin 210 is the smallest. The inner wall of the connection section 424 can limit the signal pin 210, thus ensuring that the signal pin 210 can run through the connection section 424 and the connection section 424 can prevent the signal pin 210 from shaking, so as to ensure high connection accuracy between the signal pin 210 and the drive board 400.

According to some embodiments of the present disclosure, referring to FIG. 2 and FIG. 4, the motor controller 1 further includes a three-phase conductive column 900, a three-phase adapter 910, and a three-phase injection-molded member 920. An end of the motor connection bar 425 away from the bracket 420 is connected to the three-phase conductive column 900. The three-phase adapter 910 is mounted on the first housing 110 and connected to the three-phase conductive column 900. The three-phase injection-molded member 920 is connected to the three-phase adapter 910 and a three-phase motor (not shown). A Hall element 430 is mounted on the drive board 400 and the three-phase conductive column 900 runs through the Hall element 430.

For example, multiple three-phase conductive columns 900 are arranged/disposed. The multiple three-phase conductive columns 900 are correspondingly connected to multiple motor connection bars 425 one to one. The multiple three-phase conductive columns 900 are mounted on the same side of the bracket 420 in the width direction. The three-phase adapter 910 is provided with multiple three-phase input ends 911 and multiple three-phase output ends 912. Multiple input ends 911 are correspondingly connected to the multiple three-phase conductive columns 900 one to one. The three-phase injection-molded member 920 includes multiple three-phase conductive bars 921 spaced apart. The multiple three-phase conductive bars 921 are correspondingly connected to the multiple three-phase output ends 912 one to one. Each of a U end, a V end, and a W end of the three-phase motor is connected to one three-phase conductive bar 921.

In this way, two motors share the DC connector 700, the capacitor module 500, the control board 300, the drive board 400, the three-phase adapter 910, and the three-phase injection-molded member 920, thus reducing the cost and mounting space, and further reducing the volume of the motor controller 1. The Hall element 430 can detect the current and voltage input to the three-phase motor, and the drive board 400 transmits the signal detected by the Hall element 430 to the control board 300.

On the basis of this embodiment, in other embodiments, referring to FIG. 3, FIG. 4, and FIG. 6, the first housing 110 is provided with a three-phase wire outlet 118 and a three-phase wiring port 119. The three-phase wiring port 119 may be provided on the side of the first housing 110 facing away from the second housing 600. The three-phase injection-molded member 920 extends from the three-phase wire outlet 118 into the first housing 110 and is connected to the three-phase adapter 910.

A three-phase wiring port cover 119a is further arranged/disposed at the three-phase wire outlet 118. In an embodiment, the three-phase motor is firstly connected to the three-phase injection-molded member 920. When the motor controller 1 needs to be mounted on the three-phase motor, the three-phase wiring port cover 119*a* is opened. The three-phase injection-molded member 920 extends from the three-phase wire outlet 118 of the first housing 110 into the first housing 110. The three-phase adapter 910 and the three-phase injection-molded member 920 are connected from the three-phase wire outlet 118 by using threaded fasteners. Then, the three-phase wiring port cover 119*a* is closed. When the motor controller 1 needs to be detached from the three-phase motor, the three-phase wiring port cover 119*a* is opened. The threaded fasteners are unscrewed from the three-phase wire outlet 118 to disconnect the three-phase adapter 910 and the three-phase injection-molded member 920. The three-phase injection-molded member 920 is detached from the first housing 110 through the three-phase wire outlet 118 of the first housing 110. Then, the three-phase wiring port cover 119*a* is closed.

In some embodiments of the present disclosure, a positive electrode of the IGBT input end 230 of each of the IGBT modules 200 is connected to a positive electrode of the capacitor output end 520 of the capacitor module 500, and then passes through an IGBT upper bridge arm and a diode upper bridge arm. A negative electrode of the IGBT input end 230 of each of the IGBT modules 200 is connected to a negative electrode of the capacitor output end 520 of the capacitor module 500, and then passes through an IGBT lower bridge arm and a diode lower bridge arm. In this way, DC power can be converted into AC power, and the AC power is output through the AC bar 220 of the IGBT module 200.

In order to facilitate the AC output wiring of the multiple IGBT modules 200, three IGBT modules 200 are divided into one group to supply power to the U end, V end, and W end of one motor, and another three IGBT modules are divided into another group to supply power to the U end, the V end, and the W end of another motor. In this way, the three-phase wiring ports of the two motors face to the same direction, facilitating the sharing of the three-phase injection-molded member 920 between the two motors, so that the motor controller 1 is more compact.

A vehicle according to an embodiment of the present disclosure will be described below with reference to the accompanying drawings.

The vehicle according to the embodiment of the present disclosure includes the motor controller 1 according to the above embodiment of the present disclosure.

The vehicle according to the embodiment of the present disclosure, by using the motor controller 1 according to the above embodiment of the present disclosure, has the advantages of high heat dissipation efficiency, good electromagnetic compatibility, high space utilization rate, small size, and the like.

Other compositions and operations of the motor controller 1 and the vehicle with the same according to the embodiments of the present disclosure are known to those skilled in the art, which will not be described here in detail.

In this description, the description of the reference terms "specific embodiment", "specific example", and the like means that features, structures, materials or characteristics described in combination with the embodiment or example are included in at least one embodiment or example of the present disclosure. In this description, exemplary descriptions of the above terms do not necessarily refer to the same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

What is claimed is:

1. A motor controller, comprising:
   a box comprising a first housing, the first housing comprising a cooling chamber, and an insert-in hole and a protrude-out hole respectively disposed on two opposite sidewalls of the cooling chamber;
   an Insulated Gate Bipolar Transistor (IGBT) module disposed in the box and inserted into the cooling chamber through the insert-in hole and extending out of the protrude-out hole, two opposite side surfaces of the IGBT module in a thickness direction and an inner wall of the cooling chamber forming liquid passing gaps, and two ends of the IGBT module being respectively coupled and sealed with the first housing at the insert-in hole and the protrude-out hole respectively;
   a control board and a drive board disposed in the box, the control board being located on a surface of the drive board facing away from the IGBT module, and the drive board being connected to the control board and the IGBT module; and
   a capacitor module located on a surface of the first housing facing away from the drive board, and the capacitor module connected to the IGBT module and configured to dissipate heat through a coolant in the cooling chamber.

2. The motor controller according to claim 1, further comprising a plurality of cooling chambers comprising the cooling chamber, wherein
   an accommodating groove is defined in the first housing, the cooling chambers are disposed as at least two rows of cooling water channels spaced apart, and the accommodating groove is located between two adjacent rows of the at least two rows of cooling water channels;
   a plurality of IGBT modules comprising the IGBT module respectively correspond to the cooling chambers, and each of the IGBT modules is inserted into a corresponding cooling chamber through a corresponding insert-in hole; and
   the accommodating groove faces away from the drive board, and the capacitor module is mounted in the accommodating groove and configured to dissipate heat through the coolant in two rows of cooling water channels adjacent to the accommodating groove.

3. The motor controller according to claim 2, wherein
   the cooling chambers are disposed as two rows of cooling water channels, and the first housing comprises a liquid inlet, a liquid outlet, a first communicating water channel, and a second communicating water channel;
   two ends of the first communicating water channel are respectively in communication with corresponding first ends of the two rows of cooling water channels, the second communicating water channel is in communication with a second end of a first one of the two rows of cooling water channels, one of the liquid inlet and the liquid outlet is in communication with a second end of a second one of the two rows of cooling water channels, and the other one of the liquid inlet and the liquid outlet is in communication with the second communicating water channel; and the second communicating water channel, the first one of the two rows of cooling water channels, the first communicating water channel, and the second one of the two rows of cooling water channels are in communication and surround the accommodating groove.

4. The motor controller according to claim 3, further comprising:

a water channel cover plate, the first communicating water channel and the second communicating water channel being open on a first surface of the first housing comprising the insert-in hole, the water channel cover plate being mounted on the first surface of the first housing and covering the two rows of cooling water channels, the first communicating water channel, and the second communicating water channel, and the water channel cover plate comprising a plurality of through holes for the IGBT modules to run through.

5. The motor controller according to claim 2, wherein the box further comprises:

a first cover plate mounted on the first housing and covering the accommodating groove.

6. The motor controller according to claim 1, wherein the box further comprises:

a second housing mounted on the first housing, wherein the drive board is located between the second housing and the first housing, and the control board is located on a surface of the second housing facing away from the first housing.

7. The motor controller according to claim 6, further comprising:

a DC connector mounted on a first surface of the first housing facing the second housing, and the first housing comprising a bus interface for exposing the DC connector;

a DC adapter mounted on the first surface of the first housing, a DC input end of the DC adapter connected to the DC connector, and a DC output end of the DC adapter connected to the capacitor module; and a magnetic ring mounted on the DC adapter and located between the DC input end and the DC output end.

8. The motor controller according to claim 7, wherein the capacitor module is mounted on a second surface of the first housing facing away from the second housing and comprises a capacitor input end and a capacitor output end, the first housing comprises a DC via, and the capacitor input end runs through the DC via and is connected to the DC output end of the DC adapter;

an IGBT input end of the IGBT module is disposed close to the protrude-out hole, and the IGBT input end extends out of the protrude-out hole and is connected to the capacitor output end; and a DC shielding cavity is formed in the first surface of the first housing facing to the second housing, the DC connector, the DC input end of the DC adapter, and the magnetic ring are disposed in the DC shielding cavity, and the bus interface runs through a sidewall of the DC shielding cavity.

9. The motor controller according to claim 7, wherein the second housing comprises a fixing hole, the DC connector comprises a DC bar, the DC bar runs through the fixing hole and is fixed to the second housing, and the DC bar is connected to the DC input end of the DC adapter; and the second housing further comprises a signal via, the drive board comprises a drive board signal pin, the control board comprises a signal pin socket, and the drive board signal pin runs through the signal via and is inserted into the signal pin socket.

10. The motor controller according to claim 6, further comprising:

a discharge resistor comprising a connection end, the second housing comprising a discharge via, the connection end running through the discharge via and being connected to the capacitor module, and the discharge resistor and the capacitor module forming a conductive loop; and a high-voltage sampling terminal connected in parallel with the discharge resistor, the control board comprising a high-voltage sampling connection base, and the high-voltage sampling terminal being connected to the high-voltage sampling connection base, the box further comprising a second cover plate, the surface of the second housing facing away from the first housing comprising a placement groove, the control board disposed in the placement groove, and the second cover plate mounted on the second housing to cover the placement groove; and a surface of the control board facing away from the second housing comprising a control board signal connector, the second cover plate comprising a signal interface, and the control board signal connector extending from the signal interface.

11. The motor controller according to claim 1, wherein a bracket is disposed between the drive board and the first housing, the bracket comprises a signal pin column and a motor connection bar, an end of the IGBT module close to the insert-in hole comprises a signal pin and an AC bar, the signal pin runs through the signal pin column and is connected to the drive board, and the AC bar is connected to the motor connection bar.

12. The motor controller according to claim 11, wherein the signal pin column comprises a guide section, a transition section, and a connection section disposed along an axial direction of the signal pin column, the guide section is disposed at an end of the signal pin column close to the IGBT module, an inner diameter of the guide section is greater than an inner diameter of the connection section, the transition section is connected to the guide section and the connection section, and an inner diameter of the transition section gradually decreases in a direction from the guide section to the connection section.

13. The motor controller according to claim 11, further comprising:

a three-phase conductive column connected to an end of the motor connection bar away from the bracket;

a three-phase adapter mounted on the first housing and connected to the three-phase conductive column;

a three-phase injection-molded member connected to the three-phase adapter and a three-phase motor, a Hall element being mounted on the drive board, and the three-phase conductive column running through the Hall element; and the first housing comprising a three-phase wire outlet and a three-phase wiring port, and the three-phase injection-molded member extending from the three-phase wire outlet into the first housing and being connected to the three-phase adapter.

14. A vehicle, comprising a motor controller, wherein the motor controller comprises:

a box comprising a first housing, the first housing comprising a cooling chamber, and an insert-in hole and a protrude-out hole respectively disposed on two opposite sidewalls of the cooling chamber;

an Insulated Gate Bipolar Transistor (IGBT) module disposed in the box and inserted into the cooling chamber through the insert-in hole and extending out of the protrude-out hole, two opposite side surfaces of the IGBT module in a thickness direction and an inner wall of the cooling chamber forming liquid passing gaps, and two ends of the IGBT module being respectively coupled and sealed with the first housing at the insert-in hole and the protrude-out hole respectively;

a control board and a drive board disposed in the box, the control board being located on a surface of the drive board facing away from the IGBT module, and the drive board being connected to the control board and the IGBT module; and a capacitor module located on a surface of the first housing facing away from the drive board, and the capacitor module connected to the IGBT module and configured to dissipate heat through a coolant in the cooling chamber.

15. The vehicle according to claim 14, wherein the motor controller further comprises a plurality of cooling chambers comprising the cooling chamber, wherein an accommodating groove is defined in the first housing, the cooling chambers are disposed as at least two rows of cooling water channels spaced apart, and the accommodating groove is located between two adjacent rows of the at least two rows of cooling water channels;

a plurality of IGBT modules comprising the IGBT module respectively correspond to the cooling chambers, and each of the IGBT modules is inserted into a corresponding cooling chamber through a corresponding insert-in hole; and the accommodating groove faces away from the drive board, and the capacitor module is mounted in the accommodating groove and configured to dissipate heat through the coolant in two rows of cooling water channels adjacent to the accommodating groove.

16. The vehicle according to claim 15, wherein the cooling chambers are disposed as two rows of cooling water channels, and the first housing comprises a liquid inlet, a liquid outlet, a first communicating water channel, and a second communicating water channel;

two ends of the first communicating water channel are respectively in communication with corresponding first ends of the two rows of cooling water channels, the second communicating water channel is in communication with a second end of a first one of the two rows of cooling water channels, one of the liquid inlet and the liquid outlet is in communication with a second end of a second one of the two rows of cooling water channels, and the other one of the liquid inlet and the liquid outlet is in communication with the second communicating water channel; and the second communicating water channel, the first one of the two rows of cooling water channels, the first communicating water channel, and the second one of the two rows of cooling water channels are in communication and surround the accommodating groove.

17. The vehicle according to claim 16, wherein the motor controller further comprises:

a water channel cover plate, the first communicating water channel and the second communicating water channel being open on a first surface of the first housing comprising the insert-in hole, the water channel cover plate being mounted on the first surface of the first housing and covering the two rows of cooling water channels, the first communicating water channel, and the second communicating water channel, and the water channel cover plate comprising a plurality of through holes for the IGBT modules to run through.

18. The vehicle according to claim 15, wherein the box further comprises:

a first cover plate mounted on the first housing and covering the accommodating groove.

19. The vehicle according to claim 14, wherein the box further comprises:

a second housing mounted on the first housing, wherein the drive board is located between the second housing and the first housing, and the control board is located on a surface of the second housing facing away from the first housing.

20. The vehicle according to claim 19, wherein the motor controller further comprises:

a DC connector mounted on a first surface of the first housing facing the second housing, and the first housing comprising a bus interface for exposing the DC connector;

a DC adapter mounted on the first surface of the first housing, a DC input end of the DC adapter connected to the DC connector, and a DC output end of the DC adapter connected to the capacitor module; and a magnetic ring mounted on the DC adapter and located between the DC input end and the DC output end.

* * * * *